(12) United States Patent
Lee (10) Patent No.: US 7,859,266 B2
(45) Date of Patent: Dec. 28, 2010

(54) METHOD OF DETECTING SOIL STRUCTURE USING VOLTAGE SLOPE AND MEASURING EARTH RESISTANCE

(75) Inventor: Sang-Mu Lee, Daejeon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 415 days.

(21) Appl. No.: 11/912,786

(22) PCT Filed: Apr. 27, 2006

(86) PCT No.: PCT/KR2006/001580

§ 371 (c)(1),
(2), (4) Date: Oct. 26, 2007

(87) PCT Pub. No.: WO2006/115380

PCT Pub. Date: Nov. 2, 2006

(65) Prior Publication Data

US 2008/0265897 A1    Oct. 30, 2008

(30) Foreign Application Priority Data

Apr. 27, 2005   (KR) ..................... 10-2005-0034921

(51) Int. Cl.
*G01V 3/02* (2006.01)
*G01R 27/20* (2006.01)

(52) U.S. Cl. .................... 324/358; 324/347; 324/691

(58) Field of Classification Search ................ 324/347, 324/348, 349, 350, 354, 357, 358, 691, 713, 324/717

See application file for complete search history.

(56) References Cited

U.S. PATENT DOCUMENTS 2,138,818 A * 12/1938 Jakosky ................... 324/357
2,368,218 A * 1/1945 Hayes ...................... 324/348

FOREIGN PATENT DOCUMENTS

| JP | 5-87847 A | 4/1993 |
| JP | 11-002650 A | 1/1999 |
| JP | 2003-245015 A | 9/2003 |
| KR | 2003-0049340 A | 6/2003 |

OTHER PUBLICATIONS

Amoruso et al., Analysis of Large Grounding Systems for Earth-Resistance Measurements in Two-Layer Soils, IEEE Proceedings, vol. 136, Pt. C. No. 3, May 1989, all.*

(Continued)

*Primary Examiner*—Kenneth J Whittington
(74) *Attorney, Agent, or Firm*—Jae Y. Park; Kile Park Goekjian Reed & McManus (57) ABSTRACT

A method of accurately measuring earth resistance even when the composition state of soil that affects the installation of a metering device for measuring earth resistance is unknown. The method comprises measuring a potential at a first potential electrode point, measuring a potential at a second potential electrode point, calculating a voltage slope corresponding to a change rate of potential difference, using a potential difference between the first and second potential electrode points, and setting a potential point according to voltage slope characteristics and measuring earth resistance. A measurement approximating an accurate value of earth resistance can be performed even when soil composition characteristics are unknown at a site.

6 Claims, 6 Drawing Sheets

OTHER PUBLICATIONS

Jeff Jowett, Slope Method, NETA World, Summer 2002 pp. 1-2.*
Jeff Jowett, Measuring Ground Resistance-The Fall of Potential Method, Spring 2002, pp. 1-4.*
International Search Report for corresponding International Application N. PCT/KR2006001580 dated Apr. 27, 2006.
Ground Impedance Measurement and Interpretation in Various Soil Structures, Dawalibi et al., IEEE Power Engineering Society Winter Meeting, vol. 3, 2000, pp. 2029-2034.

* cited by examiner

METHOD OF DETECTING SOIL STRUCTURE USING VOLTAGE SLOPE AND MEASURING EARTH RESISTANCE

TECHNICAL FIELD

The present invention relates to grounding technology having a function to discharge a leakage current or an unnecessary noise signal into the earth so as to prevent malfunction of general industrial facilities including electric communication facilities, to stabilize communication services and to prevent human body from damage, and more particularly, to a method of detecting a soil structure using a voltage slope and measuring earth resistance.

BACKGROUND ART

The fall-of-potential method is a representative technology for measuring earth resistance. In particular, the 3-point fall-of-potential method is usually used. In the 3-point fall-of-potential method, positioning of two auxiliary electrodes including a current electrode and a potential electrode is important during installation. In particular, the position of the potential electrode is a critical factor in accurately measuring earth resistance. The position of the potential electrode is affected by soil composition characteristics at a measuring site. With regard to this, the position of a potential electrode for providing an accurate measurement of earth resistance in a variety of soil composition types was introduced by Dawalibi [IEEE Power Engineering Society Winter Meeting, Vol. 3, pp. 23-27, 2000].

DISCLOSURE OF INVENTION

Technical Problem

However, the composition state of soil cannot be fully gauged at an actual site without performing specific operations.

Thus, in a conventional method of measuring earth resistance, measurement is inaccurate unless soil composition characteristics are taken into account.

Technical Solution

The present invention provides a method of measuring earth resistance by determining a potential point (a percentage ratio of a potential electrode separation distance to a current electrode separation distance) in which the effect of soil composition characteristics or measurement of underground installation is taken into account, when the 3-point fall-of-potential method of measuring earth resistance is used.

Advantageous Effects

As described above, according to the present invention, unlike a conventional method of determining and measuring a potential point approximating a true value of earth resistance based on an assumption that soil composition characteristics are already known using earth resistance measurement technology, soil composition characteristics can be detected in reverse order and the direction of the underground installation can also be detected. In addition, the potential point at which the soil composition has an effect on a unknown soil structure is calculated, and the earth resistance is measured at the potential point so that precise measurement could be achieved.

BEST MODE

According to an aspect of the present invention, there is provided a method of measuring earth resistance, the method comprising: measuring a potential at a first potential electrode point; measuring a potential at a second potential electrode point; calculating a voltage slope corresponding to a change rate of potential difference, using a potential difference between the first and second potential electrode points; and setting a potential point according to voltage slope characteristics and measuring earth resistance.

According to another aspect of the present invention, there is provided a method of measuring earth resistance based on soil composition characteristics detection or underground installation detection, the method comprising: calculating voltage slopes with respect to a plurality of current electrode directions; comparing the calculated voltage slopes and detecting soil composition characteristics or direction of the underground installation; and determining positions of potential electrodes according to the detected soil composition characteristics or direction of the underground installation and measuring earth resistance.

According to another aspect of the present invention, there is provided a method of measuring earth resistance in a single current electrode direction, the method comprising: setting a reference voltage slope according to types of respective earth body facilities; calculating voltage slopes with respect to current electrode directions measured at a site; and selecting positions of potential electrodes according to a quantitative relationship between the reference voltage slope and the measured voltage slopes and measuring earth resistance.

Mode For Invention

Figure 1:
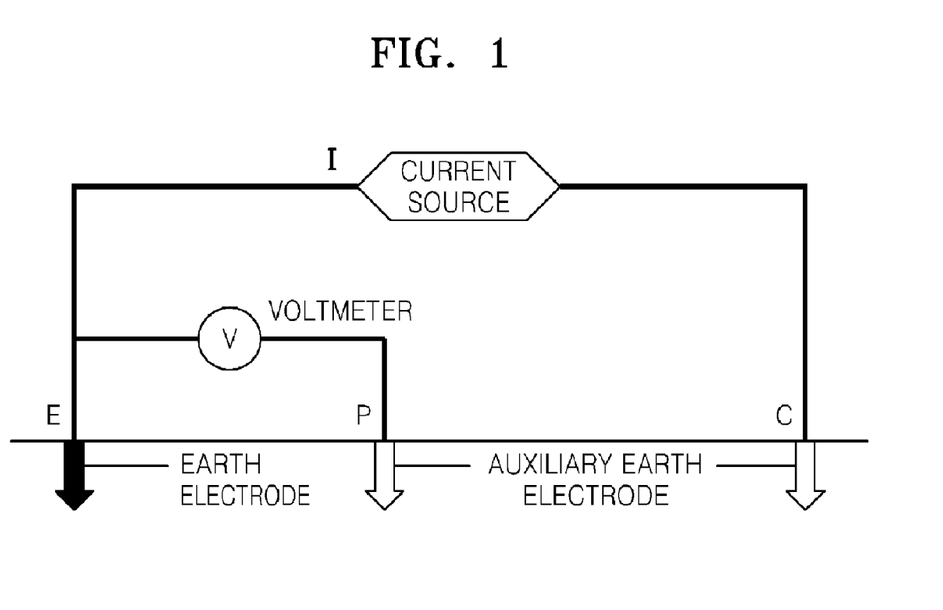
FIG. 1 is a schematic view of a circuit for measuring earth resistance according to an embodiment of the present invention.

FIG. 1 is a schematic view of a circuit for measuring earth resistance according to an embodiment of the present invention. The circuit for measuring earth resistance of FIG. 1 uses the 3-point fall-of-potential method. That is, in the 3-point fall-of-potential method, two auxiliary electrodes such as a current electrode C and a potential electrode P are used. In addition, an earth electrode E is an earth facility in which earth resistance is measured. The earth electrode E is also referred to as an earth body. The current electrode C is a return electrode with respect to a test current I used for measurement purposes. Thus, in the method of measuring earth resistance, the potential electrode P is positioned correctly in a circuit as illustrated in FIG. 1, voltage drop caused by the earth electrode E is measured, and the earth resistance is measured using a ratio (V/I) of the measured voltage to the test current I according to Ohm's law.

Figure 2:
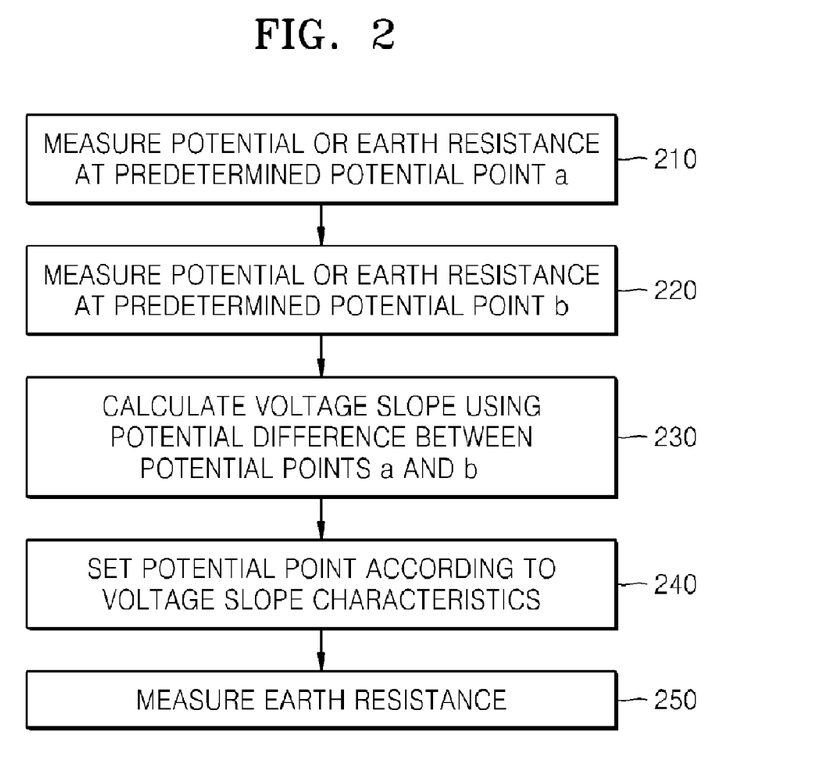
FIG. 2 is a flowchart illustrating a method of measuring earth resistance according to an embodiment of the present invention.

FIG. 2 is a flowchart illustrating a method of measuring earth resistance according to an embodiment of the present invention. First, potential or earth resistance is measured at a predetermined potential point a in operation 210. Subsequently, potential or earth resistance is measured at another predetermined potential point b in operation 220.

Subsequently, a voltage slope is calculated using a potential difference between the two potential points a and b or by using the measured earth resistance in operation 230. That is, the voltage slope is calculated using Equation 1:

$$\varepsilon = \left(\frac{P_a}{P_b} - 1\right) \times 100[\%] \quad (1)$$

, where $P_a$ is a potential measured at the potential point a and $P_b$ is a potential measured at the potential point b (where, $P_a > P_b$).

Figure 3:
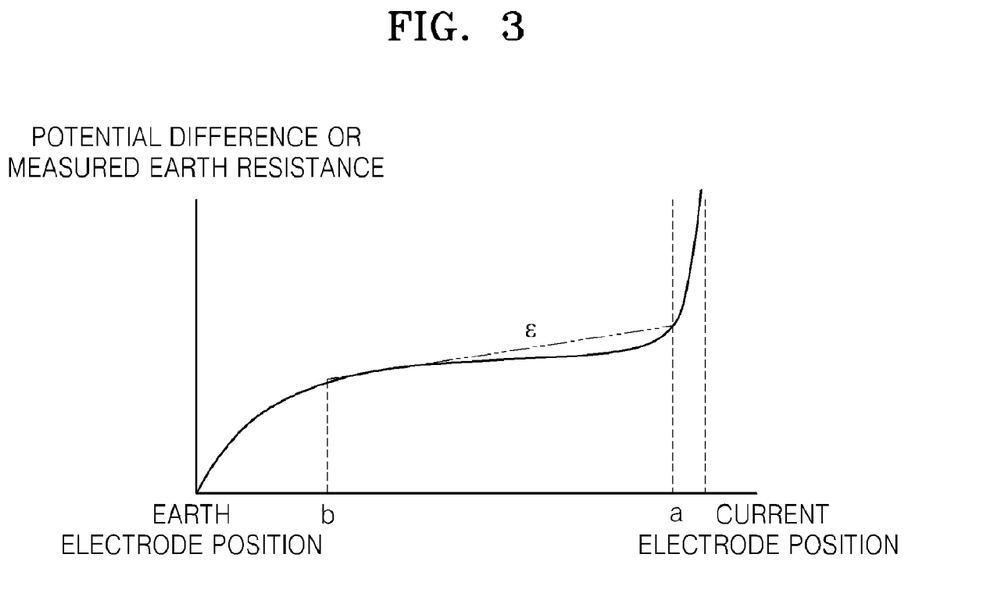
FIG. 3 is a graph showing a voltage slope used in the method of measuring earth resistance as illustrated in the flowchart of FIG. 2.

The voltage slope can be expressed as illustrated in FIG. 3. FIG. 3 is a graph showing a voltage slope used in the method of measuring earth resistance as illustrated in the flowchart of FIG. 2. Referring to FIG. 3, a slope F between two potential points a and b, in representing a line between the original position of an earth electrode and the position of a current electrode, respectively, is a voltage slope.

Subsequently, a potential point is set according to the calculated voltage slope characteristics and the earth resistance is measured in operations 240 and 250.

The voltage slope characteristics include comparison characteristics between voltage slopes with respect to a plurality of current electrode directions or calculation characteristics compared with a voltage slope of a reference potential even in a single current electrode direction according to types of earth body which will be described later, as in an embodiment of the present invention. A detailed comparison method thereof will now be described.

Figure 4:
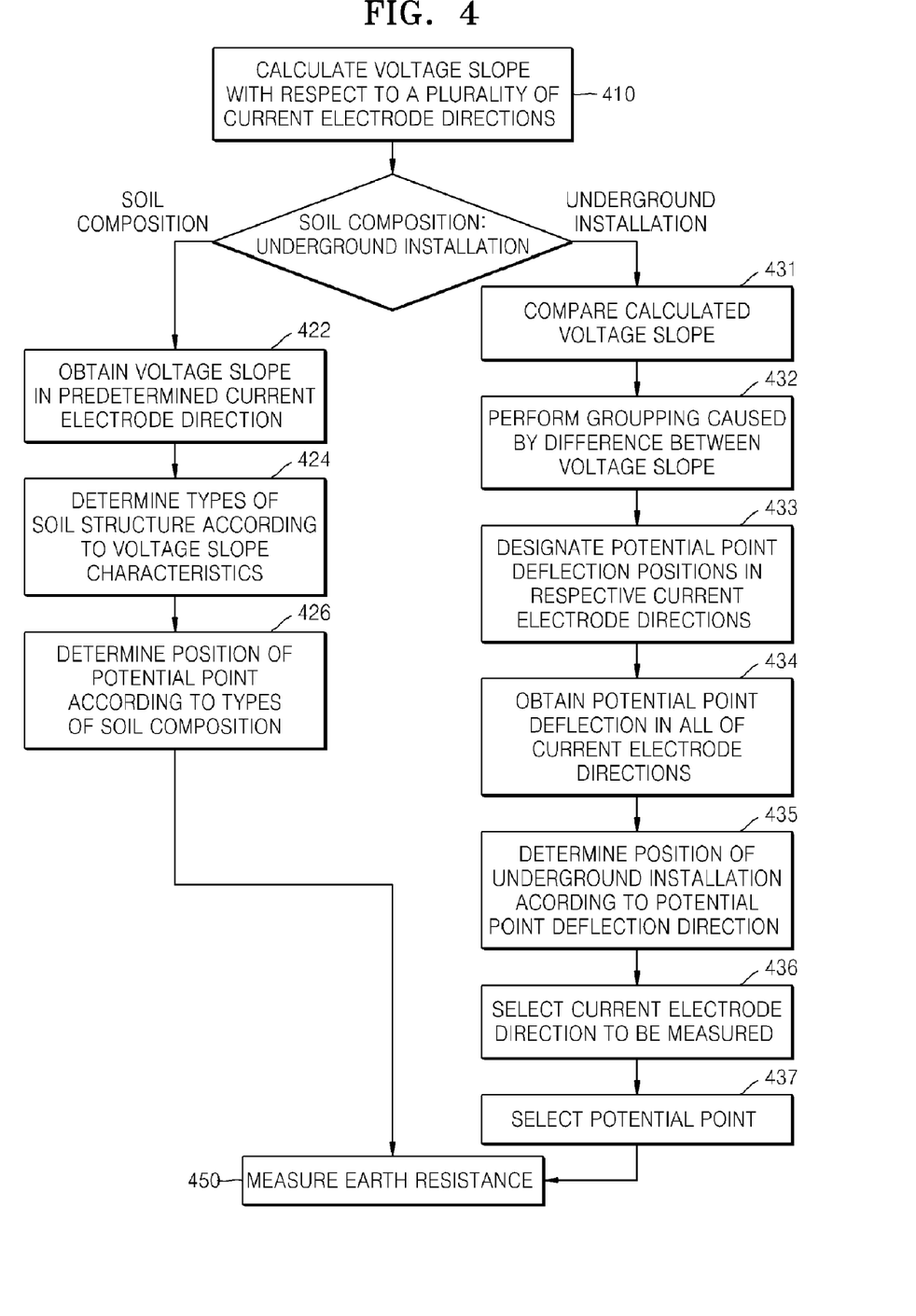
FIG. 4 is a flowchart illustrating a method of measuring earth resistance by performing soil structure detection or underground installation direction detection using a voltage slope according to an embodiment of the present invention.

FIG. 4 is a flowchart illustrating a method of measuring earth resistance by performing soil structure detection or underground installation direction detection using a voltage slope according to an embodiment of the present invention.

First, respective voltage slopes with respect to a plurality of current electrode directions are calculated in operation 410. Subsequently, it is determined whether a measurement mode is a soil composition characteristic detection mode or an underground installation direction detection mode.

If the measurement mode is determined as the soil composition characteristic detection mode, voltage slope characteristics in a predetermined current electrode direction are obtained in operation 422, types of soil composition are determined according to voltage slope characteristics in operation 424, and positions of potential points are determined according to the soil composition types in operation 426 and earth resistance is measured in operation 450. Operations 422 to 450 will be described in greater detail with reference to FIG. 5.

Figure 5:
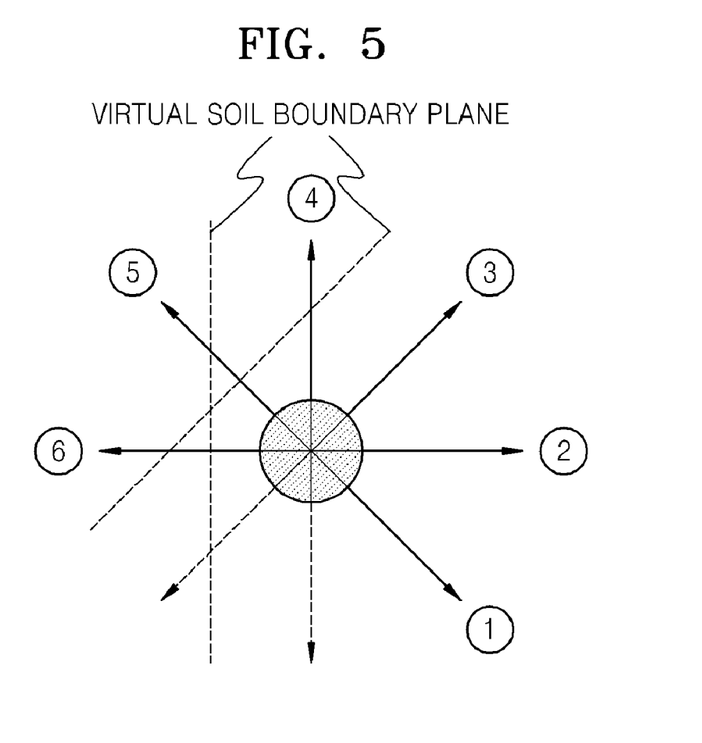
FIG. 5 is a conceptual view for measuring voltage slopes with respect to a plurality of current electrode directions for detecting soil composition characteristics detected using the method of FIG. 4 according to an embodiment of the present invention.

FIG. 5 is a conceptual view for measuring voltage slopes with respect to a plurality of current electrode directions for detecting soil composition characteristics detected using the method of FIG. 4 according to an embodiment of the present invention.

For example, it is assumed that voltage slopes with respect to 6 current electrode directions are calculated. At this time, if a voltage slope of all of three current electrode direction pairs ①, ③, and ⑤ disposed at 90° to each other is over 30% and a voltage slope in one of two current electrode direction pairs disposed at 180° to each other approximates 100%, a vertical layer soil structure is distributed near soil of a measurement site and the site can be determined as a site having a low earth resistivity of a region in which the earth body is installed. However, if voltage slopes with respect to opposite current electrodes are almost similar, the earth body is near a cylindrical soil structure. In addition, if the voltage slopes are similar in all of the three current electrode pairs, it can be interpreted that the earth body is a spherical heterogeneous soil structure or a homogeneous soil structure. For example, in the case of a homogeneous soil structure according to types of soil composition, all potential points with respect to the respective current electrode directions may be of 60%. In the case of a cylindrical soil structure, a potential point with respect to a current electrode direction ① may be of 60%, a potential point with respect to a current electrode direction ③ may be of 70%, and a potential point with respect to a current electrode direction ⑤ may be of 60%. In the case of a vertical layer soil structure, a potential point with respect to a current electrode direction ① may be of 40%, a potential point with respect to a current electrode direction ③ may be of 60%, and a potential point with respect to a current electrode direction ⑤ may be of 70%.

Subsequently, if the measurement mode is determined as the underground installation direction detection mode, calculated voltage slopes are compared in operation 431, grouping caused by differences between voltage slopes is performed in operation 432, potential point deflection positions in respective current electrode directions are designated in operation 433, potential point deflections to all of the current electrode directions is obtained in operation 434, the position of the underground installation is determined according to a potential point deflection direction in operation 435, the current electrode direction is selected according to the position of the underground installation in operation 436 and the potential point is selected in operation 437 and the earth resistance is measured by selection of the potential point in operation 450.

Figure 6:
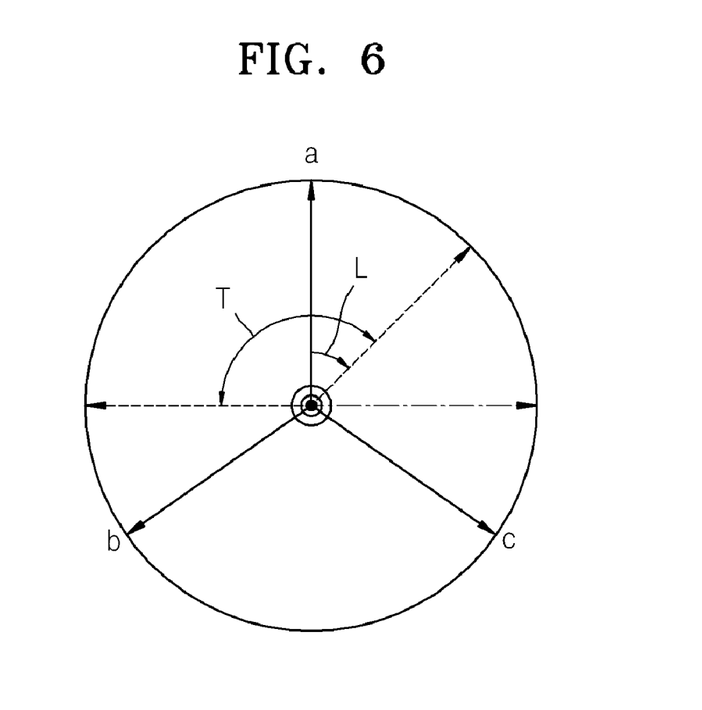
FIG. 6 shows a model for setting a direction of a current electrode for detecting the effect of neighboring underground installation, the direction of which is detected in the method of FIG. 4.
Figure 7A:
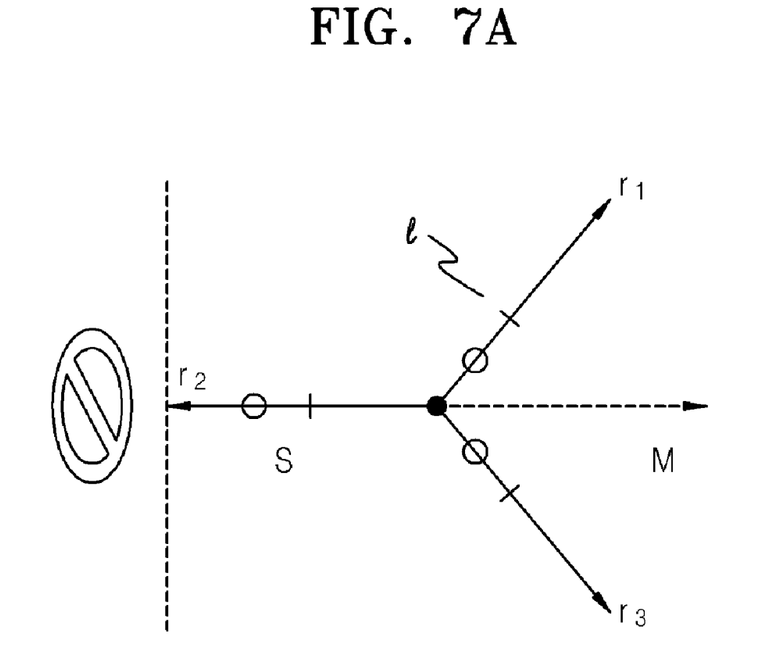
FIGS. 7A and 7B show a model for grouping voltage slopes of respective current electrode directions for detecting a direction of underground installation when detection of the effect of the underground installation of FIG. 6 is measured.

Operations 431 to 450 will be described in greater detail with reference to FIGS. 6 and 7. FIG. 6 shows a model for setting a direction of a current electrode for detecting the effect of neighboring underground installation, the direction of which is detected in the method of FIG. 4, and FIGS. 7A and 7B show a model for grouping voltage slopes of respective current electrode directions for detecting a direction of underground installation when detection of the effect of the underground installation of FIG. 6 is measured.

As illustrated in FIG. 6, voltage slopes with respect to three current electrode directions a, b, and c having an equal angular relationship are calculated. Subsequently, correlation with respect to the three current electrode directions a, b, and c is compared and the direction of the underground installation in the earth which affects measured earth resistance is positioned as illustrated in FIGS. 7A and 7B. The proper angular relationship of the three current electrode directions a, b, and c maximizes a separation angle formed among a plurality of current electrode directions in which voltage slopes are to be measured. In FIG. 6, a correlation separation angular relationship in the case of only three current electrode directions is shown. That is, the proper angular relationship of the three current electrode directions is established when a separation angle between respective adjacent current electrode directions is 120°. A symbol 'L' indicates a minimum separation angle between two adjacent current electrode directions and may be about 45°. A symbol 'T' indicates a directional angle through the three current electrode directions and should be 180° in minimum. Referring to FIGS. 7A and 7B, in terms of voltage slope characteristics with respect to the three current electrode directions, when a difference between voltage slopes of a pair of current electrodes is about 10% and a difference between voltage slopes of a pair of current electrodes is over 20%, the direction of the current electrodes can be grouped in any combination of three voltage slopes. When the difference between two voltage slopes approximates about 10% and the two voltage slopes are smaller than the other voltage slope, the three voltage slopes are shown in the shape as illustrated in FIG. 7B. When the two voltage slopes are larger than the other voltage slope, the three voltage slopes are shown in the shape as illustrated in FIG. 7A. In FIGS. 7A and 7B, $r_1/r_2/r_3$ is a detection measurement current electrode direction. Small cut lines f indicates positions corresponding to 60% of a current electrode length. Small circles in each line indicate a simple virtual position of deflection of a potential point which can be determined depending on whether voltage slopes with respect to respective current electrode directions are high or low when compared to 60%. Referring to FIG. 7A, when positions of virtual potential points $r_1$ and $r_3$ are low and the position of a virtual potential point $r_2$ is high, it can be determined that there is a structure that may affect the measurement in the direction $r_2$ or there is a low earth resistivity. In this case, an effect that may cause measuring errors should be excluded. Thus, the direction of the current electrode in which earth resistance is to be actually measured is set to an M direction, indicated by a dotted line in the drawing, which is in a direction opposite to an available direction of $r_2$. Since the potential point can be changed by the effect of the direction of $r_2$ the earth resistance is measured and determined at 50% of as the potential point to the current electrode in the M direction.

Figure 7B:
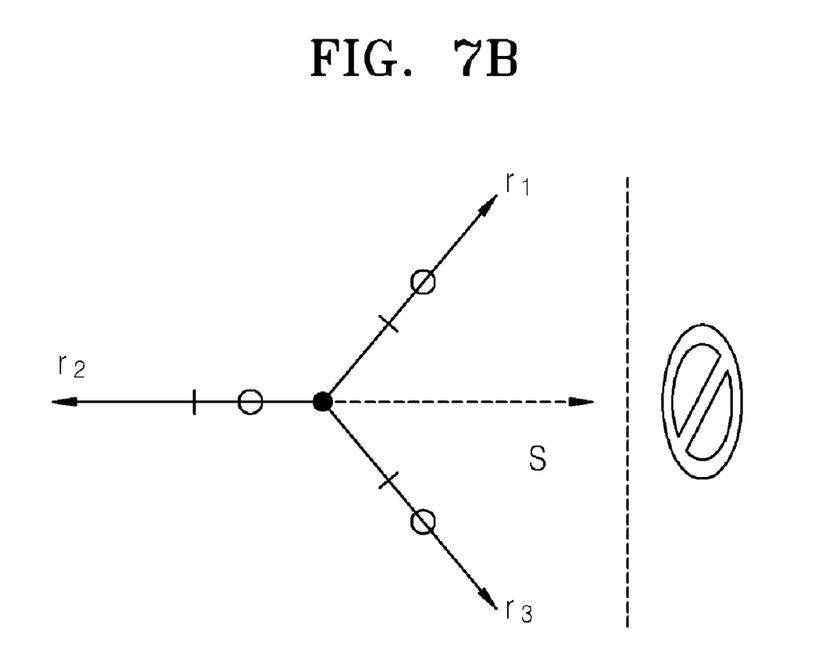

Referring to FIG. 7B, it can be known from the deflection of the virtual potential point that there is a structure in a direction opposite to $r_2$ that may affect the measurement. In this case, the earth resistance is obtained at 50% a s the potential point to the current electrode of the direction of $r_2$.

Figure 8:
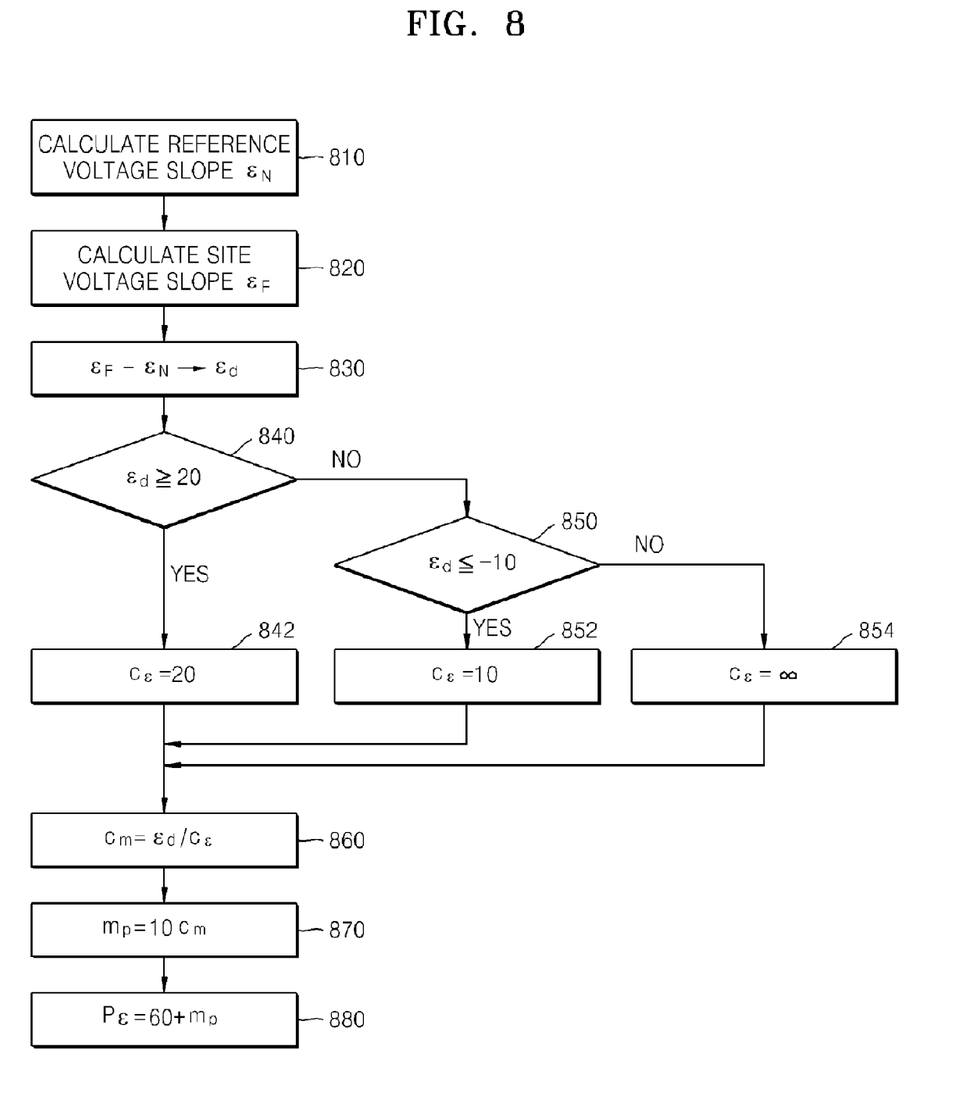
FIG. 8 is a flowchart illustrating a method of measuring earth resistance, by only using a voltage slope with respect to one current electrode direction, according to another embodiment of the present invention.

FIG. 8 is a flowchart illustrating a method of measuring earth resistance by using only a voltage slope with respect to one current electrode direction according to another embodiment of the present invention. A potential point approximating a value of earth resistance is obtained and the earth resistance is measured so that the soil has an effect only when using a voltage slope with respect to only one current electrode direction when the composition of soil is unknown. To this end, a reference voltage slope according to types of respective earth body facilities can be obtained using Equations 2 and 3 in operation 810:

$$\varepsilon_v = \frac{120}{m+4} + 10[\%] \quad (2)$$

$$\varepsilon_h = \frac{172.8}{m-1.2} + 14[\%] \quad (3)$$

, where $\varepsilon_v$ is a reference change rate with respect to vertical depth type earth facilities, $\varepsilon_h$ is a reference change rate with respect to horizontal tangential plane type earth facilities, and m is a multiple of an earth body facility specification of a measured current electrode separation distance.

The earth body facility specification is an earth depth in the case of the vertical depth type earth facilities and is an area conversion diameter in the case of the horizontal tangential plane type earth facilities. If the earth body facility specification is $d_g$ and the current electrode separation distance is $d_c$, then $m=d_c/d_g$. In addition, the area conversion diameter is a diameter of a circle when the horizontal tangential plane of the earth body is replaced with a circular area, when the tangential plane of the earth body is S, $$\sqrt{4S/\pi}$$

Subsequently, a voltage slope $\varepsilon_F$ with respect to a corresponding measurement current electrode direction is calculated in operation 820.

Subsequently, when the reference change rate calculated using Equations 2 and 3 is referred to as $\varepsilon_N$ and the voltage slopes calculated with respect to the corresponding current electrode direction is $\varepsilon_F$, a difference between voltage slopes is obtained using Equation 4 in operation 830.

$$\varepsilon_d = \varepsilon_N - \varepsilon_F \quad (4)$$

Subsequently, when a potential point approximating a true value of earth resistance using a change rate with respect to a single current electrode direction is P, $P=60+m_p$ in operation 880.

Here, $m_p$ is an amount of potential point movement obtained using Equation 5 and 60 is a reference potential point determined from the 61.8% rule in the measurement case of homogeneous soil.

$m_p = 10c_m$ ($c_m$: potential point movement coefficient)

$c_m = \varepsilon_d/c_e$ ($c_e$: transition rate comparison coefficient)

$\varepsilon_F < \varepsilon_N$ and $|\varepsilon_d| \geq 10 : c_e = 10$ $$\varepsilon_F > \varepsilon_N \text{ and } |\varepsilon_d| \geq 20 : c_e = 20 \quad (5)$$

Except for in the above range, $c_e = \infty$.

The 'potential difference' described in the above-described embodiments of the present invention can be replaced with 'earth resistance' measured at a potential point.

INDUSTRIAL APPLICABILITY

The invention can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

The invention claimed is:

1. A method of measuring earth resistance based on soil composition characteristics detection or underground installation detection, the method comprising:

calculating voltage slopes with respect to a plurality of current electrode directions;

comparing the calculated voltage slopes and detecting soil composition characteristics or direction to the underground installation; and determining positions of potential electrodes according to the detected soil composition characteristics or direction to the underground installation and measuring earth resistance.

2. The method of claim 1, wherein the measuring of the earth resistance based on soil composition characteristics detection comprises:

obtaining voltage slope characteristics with respect to a predetermined current electrode direction;

determining types of soil composition according to the voltage slope characteristics; and determining positions of potential points according to the types of soil composition and measuring the earth resistance.

3. The method of claim 1, wherein the measuring of the earth resistance based on underground installation detection comprises:

comparing voltage slopes;

performing grouping according to differences between voltage slopes;

designating potential point deflection positions in the respective current electrode directions;

obtaining potential point deflection to all of the current electrode directions;

determining a position of the underground installation according to the potential point deflection direction; and selecting a current electrode direction according to the position of the underground installation and determining a potential point.

4. A method of measuring earth resistance in a single current electrode direction, the method comprising:

setting a reference voltage slope according to types of respective earth body facilities;

calculating voltage slopes with respect to current electrode directions measured at a site; and selecting positions of potential electrodes according to a quantitative relationship between the reference voltage slope and the measured voltage slopes and measuring earth resistance.

5. The method of claim 4, wherein the setting of the reference voltage slopes comprises calculating the reference voltage slope using a multiple of a current electrode separation distance with respect to a corresponding earth body facility specification according to the types of earth body facilities.

6. The method of claim 4, wherein the selecting of the positions of the potential electrodes comprises:

setting variables or coefficients and constants to obtain a quantitative relationship between the reference voltage slope and the measured voltage slope with respect to a reference potential point $P_N$ that can be technically determined;

determining an amount of potential point movement $m_p$ for selecting actual measurement potential points using an arithmetic operation of the variables or the coefficients and the constants; and obtaining a true value of the earth resistance or a potential point P approximating the earth resistance using the following equation: $P=P_N+m_p$.

* * * * *